(12) United States Patent
Othieno et al.

(10) Patent No.: US 6,777,803 B2
(45) Date of Patent: Aug. 17, 2004

(54) SOLDER MASK ON BONDING RING

(75) Inventors: Maurice Othieno, Union City, CA (US); Aritharan Thurairajaratnam, San Jose, CA (US); Manickam Thavarajah, San Jose, CA (US); Pradip D. Patei, Redwood City, CA (US); Severino A. Legaspi, Jr., Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 71 days.

(21) Appl. No.: 10/229,659

(22) Filed: Aug. 28, 2002

(65) Prior Publication Data

US 2004/0041252 A1 Mar. 4, 2004

(51) Int. Cl.⁷ .............................................. H01L 23/52
(52) U.S. Cl. ........................ 257/691; 257/666; 257/787
(58) Field of Search ................................. 257/666, 691, 257/787

(56) References Cited

U.S. PATENT DOCUMENTS 6,194,786 B1 * 2/2001 Orcutt ......................... 257/780
6,316,828 B1 * 11/2001 Tao et al. .................... 257/723
6,635,957 B2 * 10/2003 Kwan et al. ................. 257/691

\* cited by examiner

Primary Examiner—Luan Thai
(74) Attorney, Agent, or Firm—Luedeka, Neely & Graham, P.C.

(57) ABSTRACT

An improvement to an integrated circuit package substrate of the type that has a bonding ring with an exposed upper surface, where a first portion of the exposed upper surface is for receiving a molding compound and a second portion of the exposed upper surface is for receiving an electrical connection. A solder mask is formed on the first portion of the exposed upper surface of the bonding ring.

20 Claims, 2 Drawing Sheets

SOLDER MASK ON BONDING RING

FIELD

This invention relates to the field of integrated circuit fabrication. More particularly, this invention relates to improving the reliability of packaged integrated devices, such as by reducing delamination of packaged integrated circuits.

BACKGROUND

An integrated circuit may be subjected to many different environments during its anticipated life expectancy. Therefore, a variety of design goals have been established to help ensure that the integrated circuit will not prematurely fail because of the effects of a reasonably anticipated environment in which the integrated circuit may be used.

For example, an integrated circuit may be subjected to a relatively warm and humid environment. One mode of premature failure in such an environment is called delamination. When an integrated circuit is subjected to a high humidity for an extended period of time, the water vapor from the air tends to permeate the integrated circuit package to some extent through the interfaces of the different materials and parts that comprise the integrated circuit package.

For example, water vapor may permeate a molded integrated circuit package at the interface between a metal pin, which by necessity must exit the package so that electrical connections can be made with the packaged integrated circuit, and the molding compound that is used to encapsulate the integrated circuit. The water vapor that enters the integrated circuit package tends to preferentially travel along the interfaces between the molded packaging and other materials, causing them to lose adhesion and come apart, one from the other. In process of time, this general delamination of the integrated circuit package can lead to a premature failure of the integrated circuit.

As a more specific example, the interfaces between metallic materials and organic materials tend to delaminate more easily than the interfaces between some other types of materials. For example, organic molding compounds tend to delaminate relatively easily from gold surfaces. Unfortunately, as the size of integrated circuits has decreased, the use of gold has generally increased because of its high electrical conductivity. Further, gold is relatively easy to make electrical connections to, such as wire bonding. Therefore, it is a preferred material for structures such as the bonding rings of an integrated circuit package.

What is needed, therefore, is a system for reducing the degree of delamination between a metallic structure, such as a gold bonding ring, and an organic compound, such as an integrated circuit molding compound.

SUMMARY

The above and other needs are met by an improvement to an integrated circuit package substrate of the type that has a bonding ring with an exposed upper surface, where a first portion of the exposed upper surface is for receiving a molding compound and a second portion of the exposed upper surface is for receiving an electrical connection. A solder mask is formed on the first portion of the exposed upper surface of the bonding ring.

In this manner, the molding compound, which has a relatively low degree of adhesion to the bonding ring, does not directly contact the bonding ring. Instead, the solder mask, which has a relatively high degree of adhesion to the bonding ring, is in contact with the bonding ring. In addition, the solder mask also has a relatively high degree of adhesion to the molding compound. Thus, the adhesion in the interfaces so created tends to be greater than the adhesion between the bonding ring and the molding compound. As prior art designs tend to have a large amount of space in the bonding ring that is not used for electrical bonding, and by which the molding compound is received, this embodiment of the present invention tends to dramatically reduce the degree of delamination at the interface between the bonding ring and the molding compound.

In various preferred embodiments of the invention, the bonding ring is formed of gold. The bonding ring is preferably either a VDD ring or a VSS ring, or most preferably the bonding ring is two rings, being both a VDD ring and a VSS ring. According to another aspect of the invention there is provided a packaged integrated circuit including the improved integrated circuit package substrate. According to yet another aspect of the invention there is provided an integrated circuit package including the improved integrated circuit package substrate.

According to a further embodiment of the invention there is provided an improvement to a method of forming an integrated circuit package substrate of the type that has a bonding ring with an upper surface, where a first portion of the upper surface is for receiving a molding compound and a second portion of the exposed upper surface is for receiving an electrical connection. A solder mask is disposed on the first portion of the upper surface of the bonding ring as an interface between the first portion of the upper surface of the bonding ring and the molding compound.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
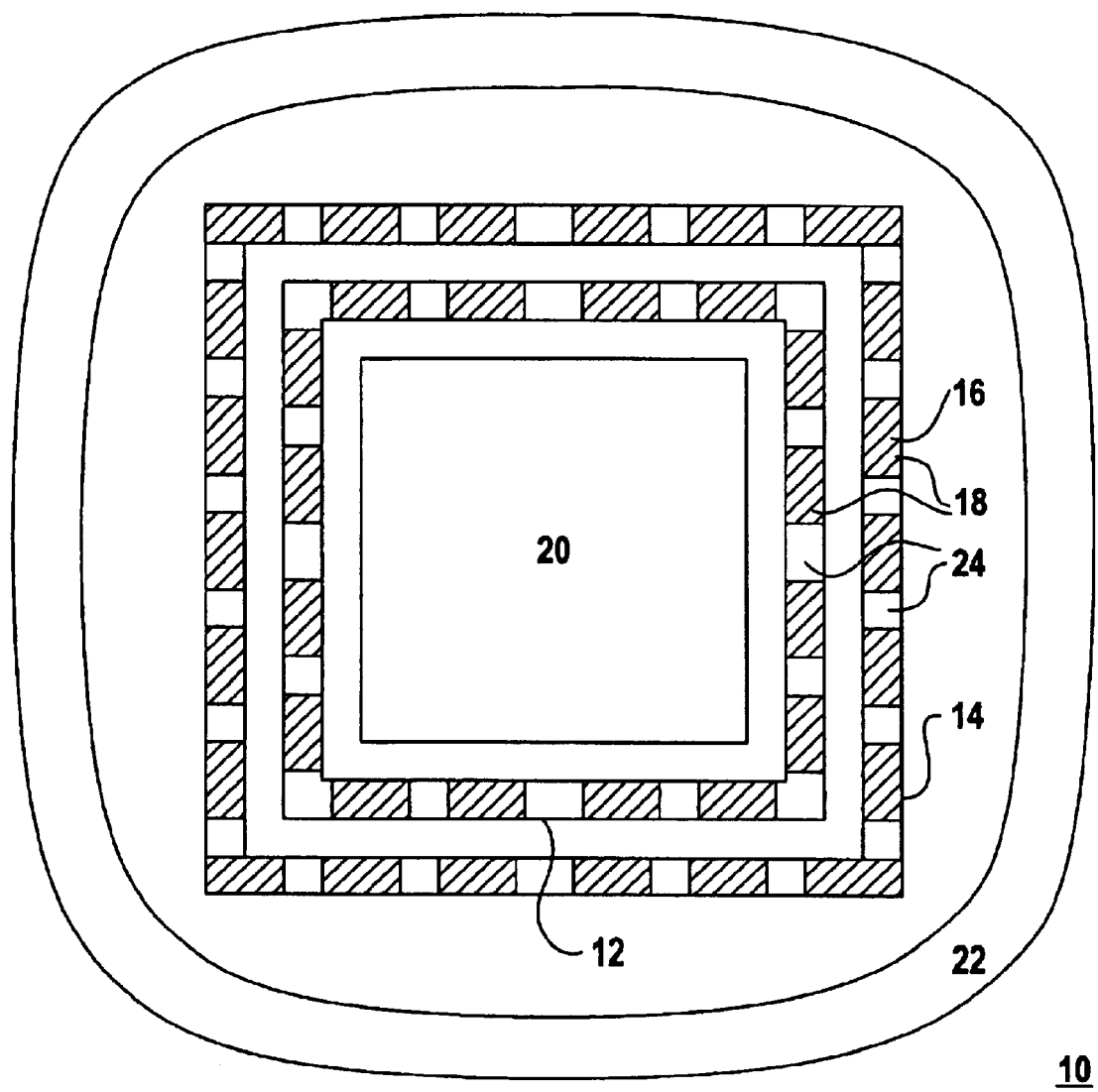
FIG. 1 is a top plan view of a portion of an integrated circuit package substrate with bonding rings, with solder mask defined on first portions of the bonding rings.

With reference now to FIG. 1 there is depicted a top plan view of a portion of an integrated circuit package substrate 10 with bonding rings 12 and 14, with photo imageable dielectric material 16 defined on first portions 18 of the bonding rings 12 and 14. Elsewhere in this disclosure, the common term of "solder mask" is used in place of the more descriptive term of "photo imageable dielectric material." The bonding rings 12 and 14 are preferably contiguous loops of an electrically conductive material, such as are commonly designated as a VDD ring and a VSS ring. It is appreciated that the shape of the bonding rings 12 and 14 is representational only, and that in actual implementation the bonding rings 12 and 14 may have a much more complex shape. Also depicted is a ring of contacts 22, to which signal leads are connected when the integrated circuit is attached to the integrated circuit package substrate 10. The signal contacts 22 are representationally depicted as a single ring in FIG. 1.

However, it is appreciated that this is solely for the purpose of simplifying the figure, and that in actual implementation the signals contacts 22 are a plurality of discrete contacts.

Those portions 24 of the bonding rings 12 and 14 on which the solder mask is not deposited are the portions to which it is intended to make electrical contact with bonding pads on the integrated circuit 20, such as by wire bonding. However, the portions 18 of the bonding rings 12 and 14, to which no electrical connections are to be made, are preferentially coated with the solder mask 16. It is appreciated that many other surface portions of the integrated circuit package substrate 10 are also covered with the solder mask 16. However, this is not depicted in FIG. 1, so as to better draw attention to the more important aspects of the invention.

The solder mask 16 material is preferably one or more of such as is available from Taiyo, Inc. of Japan, having catalog numbers of PSR-4000 AUS5, AUS307, AUS308, and AUS703. The bonding rings are preferably formed of gold, at least at their upper surface. As mentioned, many molding compounds for encapsulating the integrated circuit 20 do not adhere well to gold, and thus the relatively large gold surfaces of the bonding rings 12 and 14 tend to delaminate. By covering with solder mask 16 the portions of the bonding rings 12 and 14 that are not required for electrical connections, the total surface area of the bonding rings 12 and 14 that is exposed to the molding compound is reduced. Because the solder mask 16 preferentially exhibits a higher degree of adhesion to the molding compound, the degree of delamination in the packaged integrated circuit according to the present invention is decreased and preferably eliminated.

Figure 2:
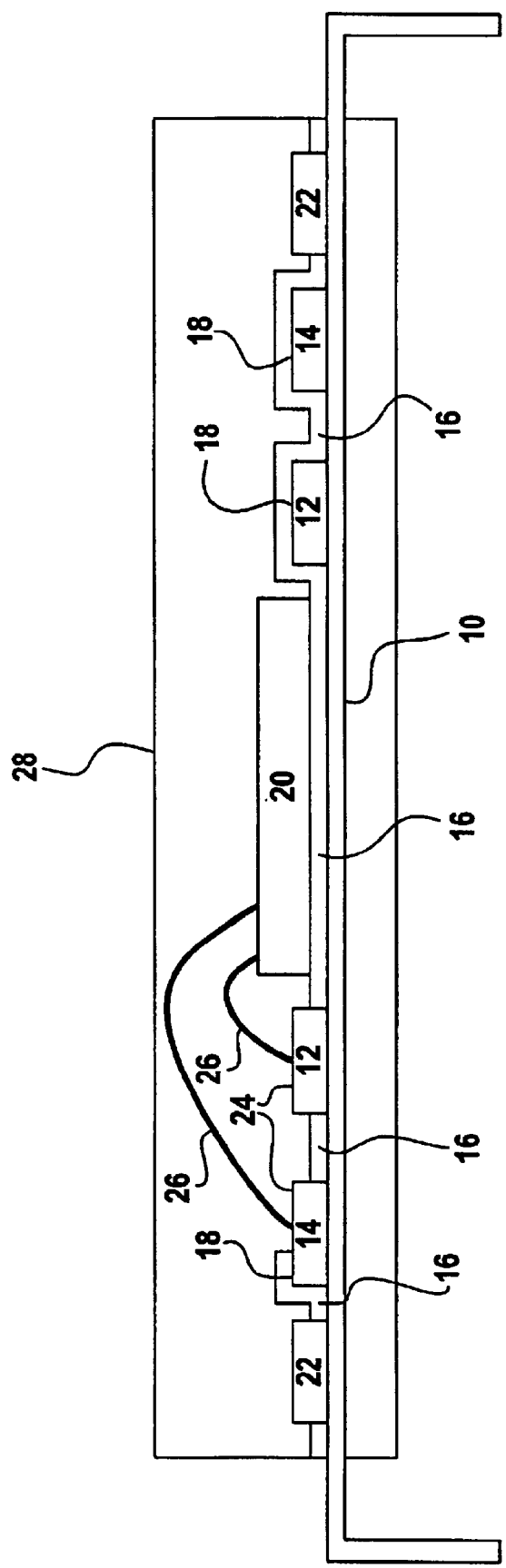
FIG. 2 is a cross sectional view of a packaged integrated circuit having an integrated circuit package substrate with bonding rings, with solder mask defined on first portions of the bonding rings.

Referring now to FIG. 2 there is depicted a cross sectional view of a packaged integrated circuit 20 having an integrated circuit package substrate 10 with bonding rings 12 and 14, with solder mask 16 defined on first portions 18 of the bonding rings 12 and 14. As depicted in FIG. 2, the solder mask 16 covers more of the integrated circuit package substrate 10 than just the first portions 18 of the bonding rings 12 and 14. Thus, the solder mask 16 can be applied to the first portions 18 of the bonding rings 12 and 14 at the same time that it is applied to the other portions of the integrated circuit package substrate 10. In this manner, an additional process step is not required. However, in an alternate embodiment, the solder mask 16 that covers the portions 18 is applied at a different time than that which is applied to the other portions of the integrated circuit package substrate 10. Further, the material used to cover the portions 18 may be a different material than that which is used to cover the other portions of the integrated circuit package substrate 10.

Also depicted in FIG. 2 are the wire leads 26 that are wire bonded to the second portions 24 of the bonding rings 12 and 14, which second portions 24 are left exposed to the molding compound 28 of the package. As depicted in FIG. 2, the first portions 18 of the bonding rings 12 and 14 that are coated with the solder mask 16 may be very close to the second portions 24 that are not so coated.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit package substrate having a bonding ring with an exposed upper surface, where a first portion of the exposed upper surface is for receiving a molding compound and a second portion of the exposed upper surface is for receiving an electrical connection, the improvement comprising a solder mask formed on the first portion of the exposed upper surface of the bonding ring, the solder mask thereby covering substantially all of the bonding ring except for those second portions required for wire bonding to an integrated circuit.

2. The integrated circuit package substrate of claim 1, wherein the bonding ring is formed of gold.

3. The integrated circuit package substrate of claim 1, wherein the solder mask is formed of a photo imageable dielectric material.

4. The integrated circuit package substrate of claim 1, wherein the bonding ring is a VDD ring.

5. The integrated circuit package substrate of claim 1, wherein the bonding ring is a VSS ring.

6. The integrated circuit package substrate of claim 1, wherein the bonding ring is two rings, comprising a VDD ring and a VSS ring.

7. A packaged integrated circuit, the improvement comprising the integrated circuit package substrate of claim 1.

8. A integrated circuit package, the improvement comprising the integrated circuit package substrate of claim 1.

9. In a packaged integrated circuit having a package substrate with a bonding ring with an upper surface, where a first portion of the upper surface receives a molding compound and a second portion of the exposed upper surface receives an electrical connection, the improvement comprising a solder mask disposed on the first portion of the upper surface of the bonding ring as an interface between the first portion of the upper surface of the bonding ring and the molding compound, the solder mask thereby covering substantially all of the bonding ring except for those second portions required for wire bonding to an integrated circuit.

10. The packaged integrated circuit of claim 9, wherein the bonding ring is formed of gold.

11. The packaged integrated circuit of claim 9, wherein the solder mask is formed of a photo imageable dielectric material.

12. The packaged integrated circuit of claim 9, wherein the bonding ring is a VDD ring.

13. The packaged integrated circuit of claim 9, wherein the bonding ring is a VSS ring.

14. The packaged integrated circuit of claim 9, wherein the bonding ring is two rings, comprising a VDD ring and a VSS ring.

15. In a method of forming an integrated circuit package substrate with a bonding ring with an upper surface, where a first portion of the upper surface is for receiving a molding compound and a second portion of the exposed upper surface is for receiving an electrical connection, the improvement comprising the step of disposing a solder mask on the first portion of the upper surface of the bonding ring as an interface between the first portion of the upper surface of the bonding ring and the molding compound, the solder mask thereby covering substantially all of the bonding ring except for those second portions required for wire bonding to an integrated circuit.

16. The method of claim 15, wherein the bonding ring is formed of gold.

17. The method of claim 15, wherein the solder mask is formed of a photo imageable dielectric material.

18. The method of claim 15, wherein the bonding ring is a VDD ring.

19. The method of claim 15, wherein the bonding ring is a VSS ring.

20. The method of claim 15, wherein the bonding ring is two rings, comprising a VDD ring and a VSS ring.

* * * * *